United States Patent [19]
Cheng

[11] Patent Number: 6,164,894
[45] Date of Patent: Dec. 26, 2000

[54] METHOD AND APPARATUS FOR INTEGRATED WAFER HANDLING AND TESTING

[76] Inventor: David Cheng, 711 Hibernia Ct., Sunnyvale, Calif. 94087

[21] Appl. No.: 08/963,722

[22] Filed: Nov. 4, 1997

[51] Int. Cl.[7] .................................................. G01R 1/04
[52] U.S. Cl. .................... 414/416; 414/222.01; 414/936; 414/937; 414/941
[58] Field of Search ..................................... 414/331, 416, 414/936, 937, 940, 941, 222.01, 783

[56] References Cited

U.S. PATENT DOCUMENTS

| | | |
|---|---|---|
| 4,204,155 | 5/1980 | Terry . |
| 4,402,613 | 9/1983 | Daly et al. . |
| 4,457,664 | 7/1984 | Judell et al. . |
| 4,665,360 | 5/1987 | Phillips . |
| 4,749,943 | 6/1988 | Black . |
| 4,755,746 | 7/1988 | Mallory et al. . |
| 4,755,747 | 7/1988 | Sato . |
| 4,775,281 | 10/1988 | Prentakis . |
| 4,786,867 | 11/1988 | Yamatsu . |
| 4,818,169 | 4/1989 | Schram et al. . |
| 4,819,167 | 4/1989 | Cheng et al. . |
| 4,853,880 | 8/1989 | Akamatsu et al. . |
| 4,907,035 | 3/1990 | Galburt et al. . |
| 4,907,931 | 3/1990 | Mallory et al. . |
| 4,929,893 | 5/1990 | Sato et al. . |
| 5,125,791 | 6/1992 | Volovich . |
| 5,159,202 | 10/1992 | Ametani . |
| 5,166,603 | 11/1992 | Hoshi . |
| 5,186,238 | 2/1993 | del Puerto et al. . |
| 5,194,743 | 3/1993 | Aoyama et al. . |
| 5,220,279 | 6/1993 | Nagasawa . |
| 5,238,354 | 8/1993 | Volovich . |
| 5,264,918 | 11/1993 | Kagami . |
| 5,270,560 | 12/1993 | Cheng . |
| 5,452,078 | 9/1995 | Cheng . |
| 5,479,108 | 12/1995 | Cheng . |
| 5,546,179 | 8/1996 | Cheng . |
| 5,549,444 | 8/1996 | Dubuit ..................................... 414/941 |
| 5,626,456 | 5/1997 | Nishi ....................................... 414/331 |
| 5,824,185 | 10/1998 | Nakamura et al. ..................... 414/941 |
| 5,851,296 | 12/1998 | Haraguchi et al. ................ 414/222.01 |
| 5,975,834 | 11/1999 | Ogawa et al. .......................... 414/941 |
| 5,980,195 | 11/1999 | Miyashita ............................... 414/783 |

FOREIGN PATENT DOCUMENTS

| | | |
|---|---|---|
| 5-206237 | 8/1993 | Japan . |

OTHER PUBLICATIONS

Creative Design Engineering, Inc., "CDE ResMap", Cupertino, CA, USA.

Creative Design Engineering, Inc., ResMap 4 point probe Rs Mapping Tool, Jun. 1997.

*Primary Examiner*—Douglas Hess
*Attorney, Agent, or Firm*—Hickman Coleman & Hughes, LLP

[57] ABSTRACT

A wafer handling and testing apparatus and method include a station for supporting a wafer carrier, such as a cassette or pod, that holds one or more wafers, where the carrier can be moved in a z-direction. A wafer handling assembly is moveable in an x-direction and removes a wafer from the wafer carrier. The handling assembly includes an end effector and a sensor for detecting an edge of the wafer. A chuck includes a platform that is movable in a z-direction and is used to lift the wafer from the handling assembly and rotate the wafer so that the sensor maps the edge of the wafer. The wafer is then centered on the platform, lowered onto the chuck, and is tested by a test head that is preferably coupled to the handling assembly.

16 Claims, 9 Drawing Sheets

METHOD AND APPARATUS FOR INTEGRATED WAFER HANDLING AND TESTING

BACKGROUND OF THE INVENTION

1. Field of the Invention

This invention relates to semiconductor manufacturing, and more particularly to handling and testing semiconductor wafers.

2. Background of the Related Art

The manufacture of integrated circuits (I.C.'s) begins with blank, unpatterned semiconductor wafers. These wafers undergo a number of sometimes critical process steps before being formed into the final I.C. form. A substandard wafer can affect the number of usable I.C.'s on a wafer (yield). It is therefore desirable to have a machine for testing wafers to ensure the wafers meet a customer's standards to maximize wafer yield. The testing of wafers is often accomplished by an automated process, in which robots continuously handle and test the wafers, which tends to be more efficient than manual testing and handling of wafers, i.e. an automated process is typically faster, more precise, and less contaminating than a manual one.

Characteristics of a wafer often need to be known to test the wafer. One characteristic is the orientation of a wafer, which is used to provide a standard reference against which the location and characteristics of test points may be measured. To provide an orientation and other information, wafers are manufactured with an index mark such as a flat or notch provided in the edge of the wafer. A testing or processing apparatus can position the wafer at a desired orientation or test a specific section of the wafer by referencing the index mark. In addition, there is often a need to know the location of the center of a wafer. For example, robot arms that handle wafers should be able to determine the center of a wafer so that the arm can reliably position the wafer on a testing platform. It is therefore desirable to have a mechanism for finding both the index mark and the center of a wafer for testing and manufacturing purposes.

One way to find wafer index marks and centers is to map the circumferential edge of a wafer and use the mapped data to find index marks and the center. This can be accomplished using a variety of methods. In one method, a wafer is positioned on a rotatable platform, where the edge of the wafer is positioned within or over a sensor. The platform is rotated, and the position of the edge of the wafer is detected by the sensor throughout the entire 360-degree rotation. From this edge information, notches or flats in the wafer's edge can be found, and the center of the wafer can be calculated. Once the edge is mapped, a robot arm picks up the wafer and places the wafer on a different testing platform, such as a test chuck, in the desired orientation. Testing and processing apparatus can then perform tests and processing at specific points on the wafer.

One problem with the prior art method is that the wafer must be transported from the edge mapping platform to a different test chuck for testing or processing. This introduces some possible error to the center location and orientation data of the wafer, since the center point of the wafer on the chuck may not be precisely known due to positional shifts of the wafer occurring during transport. Thus, the location of points on the wafer which are tested on the chuck may not be known accurately. In addition, testing and processing times for a semiconductor wafer are increased due to the time of transporting the wafer from an edge mapping apparatus to a testing/processing apparatus.

Another problem with the prior art handling mechanisms is that the cost of the mechanisms can be excessive. A robot mechanism is required to unload the wafers from the wafer carrier (cassette or pod), and the robot must have several degrees of freedom to access the wafers of the carrier, including a fairly large z-axis movement. Furthermore, the robot must be able to move the wafer from the carrier to an edge mapping station, and from there to a separate testing station. In addition, two separate rotatable platforms/chucks must be maintained, one for mapping and one for testing. These functions require complex and costly mechanisms that require more maintenance, which is undesirable in production environments.

What is needed is an apparatus and method that will quickly, accurately and economically move wafers, map the edge of wafers, and test the wafers in an integrated, simpler apparatus that requires less time and maintenance.

SUMMARY OF INVENTION

The present invention addresses the problems in the prior art by providing a method and apparatus for handling and testing wafers in an integrated system. A wafer handler and chuck includes components for handling the wafer, mapping the wafer edge, centering the wafer, and testing the wafer, all provided in a simpler, low-cost system.

More specifically, an integrated wafer handling and testing apparatus of the present invention includes a wafer handling assembly moveable in an x-y plane and which removes a wafer from a wafer carrier. The wafer handling assembly includes an end effector for supporting the wafer, and a sensor for detecting an edge of the wafer. A chuck is provided including a platform that moves in a z-direction perpendicular to the platform surface, where the wafer is placed on the platform from the end effector. A test head is provided that contacts the wafer while the wafer is supported by the chuck. In a preferred embodiment, the test head is included in the wafer handling assembly and may include, for example, a four-point probe assembly.

In one embodiment, the end effector is constrained to move only in an x direction and not in the y or z directions. Preferably, the platform is lowered to allow testing of the wafer on the chuck, where the chuck is moved up to contact the wafer with the test head. The apparatus also preferably includes a carrier station for supporting a wafer carrier that holds one or more wafers, such as a wafer cassette or pod. A z-movement mechanism is provided to move the carrier in a z-direction. The sensor can include an emitter and a detector for sensing the distance the wafer extends into the sensed range, where the wafer is rotated while the edge is in the sensor so that the wafer edge may be mapped. The sensor is preferably positioned on the wafer handling assembly above the end effector such that the wafer is lifted off the end effector by the platform to be aligned with the sensor. A computer device controls the movement of the wafer handling assembly, the carrier station, and the platform.

A method of the present invention for handling and testing wafers includes moving a wafer handling apparatus into a wafer carrier and removing a wafer. The wafer is lifted from the wafer handling apparatus using a platform moving in a z-direction. An edge of the wafer is then mapped about a circumference of the wafer while the wafer is supported by the platform. Preferably, the wafer is then centered on the platform using the wafer handling apparatus, and the wafer is tested using a test head while it is supported by a chuck which includes the platform.

Preferably, the sensor and the test head are coupled to the wafer handling apparatus. The wafer handling mechanism is moved only within an x-y plane and is not moved in a z-direction. The wafer edge mapping includes moving a sensor such that an edge of the wafer is in a sensing range of said sensor, and rotating the wafer to map the wafer edge. The centering of the wafer preferably includes rotating the wafer such that the center of the wafer and the center of the platform are aligned on an axis of movement of the wafer handling apparatus, picking up and moving the wafer with the wafer handling apparatus such that the centers of the wafer and the platform are vertically aligned, and raising the platform to lift the wafer off the wafer handling mechanism. Preferably, before raising the platform, the platform is rotated to align a reference position of the platform and chuck with an index mark of the wafer.

The present invention provides a simpler, less costly apparatus for handling and testing wafers stored in a wafer carrier such as a cassette or pod. Since many components are integrated on the wafer handling assembly, the wafer can be mapped and referenced, centered, and then tested at a single workstation such as a platform or chuck, thus reducing the amount of transport of wafers in a testing process. The components of the apparatus require motion in only a small number of degrees of freedom, thus simplifying and reducing the cost and maintenance of the apparatus.

These and other advantages of the present invention will become apparent to those skilled in the art after reading the following descriptions and studying the various figures of the drawings.

BRIEF DESCRIPTION OF THE DRAWINGS

FIGS. 4a–4d are top plan views of the wafer, wafer chuck and end effector in which the wafer is centered on the support platform;

FIG. 4a1 is a top view of a wafer having a flat index mark;

DETAILED DESCRIPTION OF THE PREFERRED EMBODIMENTS

Figure 1:
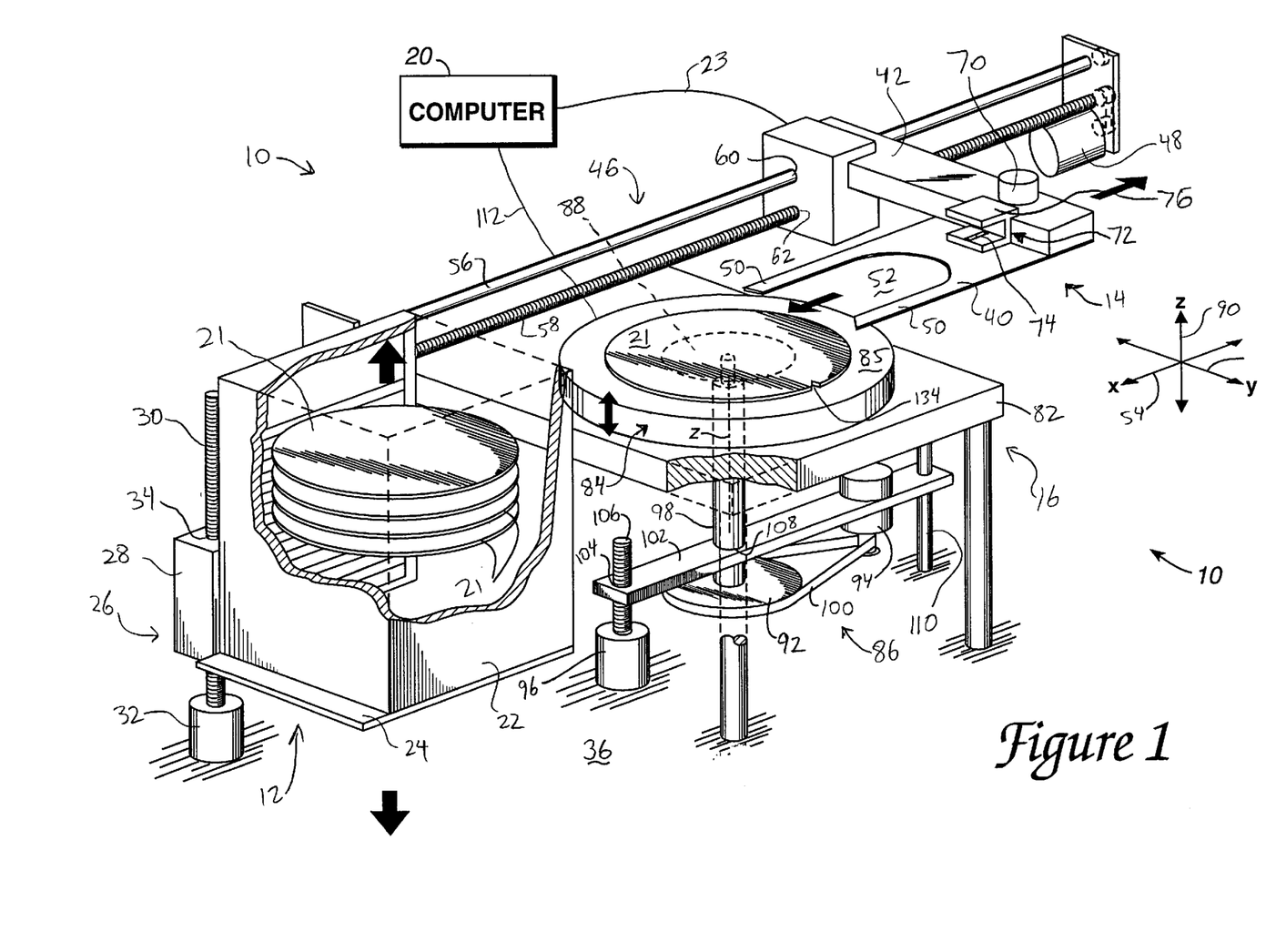
FIG. 1 is a perspective view of a the wafer handling and testing system of the present invention.

FIG. 1 is a perspective view of an-integrated wafer measuring and testing apparatus 10 of the present invention. Apparatus 10 includes a wafer carrier holding station 12, a wafer handler and probe assembly 14, a chuck assembly 16, and a computer 20.

Wafer carrier holding station 12 is used to position a wafer carrier 22 in the desired position so that wafers 21 enclosed by the carrier can be unloaded to be measured and tested by apparatus 10. Such a wafer carrier can be a wafer cassette, which holds a number of wafers in slots in an open, unsealed container; or a wafer pod, which is an enclosed and sealed container that prevents contaminants from reaching the held wafers. For example, a wafer cassette can be positioned so that its opening faces the chuck assembly 16 and wafer handler 14. Alternatively, a Front Opening Unified Pod (FOUP) can be used, which is an industry standard wafer pod that includes a door designed to be opened from the front of the carrier rather than the bottom of the carrier as in other types of pods. A door opening mechanism for such wafer pods can be used in conjunction with the present invention; one such mechanism is described in co-pending patent application Ser. No. 08/920,210 by D. Cheng, filed Aug. 25, 1997, entitled, "Method and Apparatus for Loading and Unloading Wafers from a Wafer Carrier", and which is hereby incorporated by reference herein. Any size of wafer can be handled and tested in the present invention; for example, 100 mm, 125 mm, 150 mm, 200 mm, or 300 mm wafers can be used.

In the described embodiment, the holding station 12 includes a base plate 24 and a drive assembly 26. Wafer carrier 22 is placed on base plate 24, and drive assembly 26 moves the plate 24 and carrier 22 along the z-axis to position wafers in the carrier with the wafer handler 14. In the described embodiment, drive assembly 26 includes a brace 28, a lead screw 30, and a motor 32. Brace 28 is coupled to base plate 24 and includes a threaded bore 34 (lead screw nut) engaged with lead screw 30. Screw 30 is rotated by motor 32, which can be a computer-controlled stepper motor or position servo motor positioned on a ground surface 36 below the carrier 22. As screw 30 rotates, brace 28 moves upwardly or downwardly parallel to the z-axis and carries base plate 24, which in turn supports wafer carrier 22. A computer 20 is connected to motor 32 via a bus 23, where the computer can control the motor 32 to rotate in either direction and thus move the station in either direction parallel to the z-axis. For example, motor 32 can be a stepper motor or position servo motor, and computer 20 can rotate the motor in precise steps, allowing the station 12 to move along the z-axis in small, precisely-defined increments.

Carrier 22 is thus positioned to align a particular wafer in the carrier with the wafer handling mechanism 14, as described below. When a wafer 21 is removed, measured/tested and replaced in the carrier 22, the carrier is moved to align a different wafer with the wafer handler. In this way, all the wafers in the cassette 22 can be removed and tested.

In alternate embodiments, brace 28 can be coupled to carrier 22 directly, without the need for a base plate 24. Also, different types of drive mechanisms 26 can be used to move the carrier 22 parallel to the z axis, such as cables and pulleys, gears, a hydraulic system, a linear actuator, etc. In yet other embodiments, the station 12 can be moved in other directions instead of along the z-axis, such as on the x-axis or the y-axis.

Carrier 22 can be removed from holding station 12 when all the wafers in the carrier have been tested. A different carrier can then be placed at station 12 to allow new wafers to be tested. Alternatively, the same carrier 22 can be removed from station 12, unloaded and loaded with new wafers, and repositioned on station 12. In yet other alternate embodiments, multiple carriers may also be loaded at the holding station 12. For example, an additional carrier might be stacked on top of carrier 22 and moved using the drive mechanism 26.

In embodiments where carrier 22 is a sealed wafer pod, the holding station 12 can be provided on one side of an interface panel which seals a clean environment required for the testing processing of wafers, i.e., the station 12 is located on the exterior of the environment in which processing and testing of wafers is to be accomplished. Such a panel is described in copending patent application Ser. No. 08/920,210, by D. Cheng, filed Aug. 25, 1997. The contaminant-free environment can include various mechanisms and structures such as a blower and a filter to remove contaminants from the environment and filter incoming air of contaminants.

Wafer handler and probe assembly 14 is used to unload or load a wafer 21 or other workpiece from a wafer carrier 22 as well as measure and test the wafer on chuck assembly 16. In the described embodiment, the assembly 14 preferably includes a spatula or "end effector" 40, a support arm 42, a carriage 44, a guide 46, and a motor 48. End effector 40 is a flat, spatula-like implement used to support a wafer from underneath the wafer and move the wafer to a desired location. The end effector 40 preferably includes two prongs 50 separated by space 52. This allows a platform or other supporting surface to be moved in a z-direction between prongs 50 and raise a wafer off the end effector 52 (as described below). In some embodiments, the end effector can include apertures that are coupled to a vacuum pump to cause a suction force that securely holds a wafer to the end effector, as is well-known to those skilled in the art.

End effector 40 is coupled to support arm 42, which in turn is coupled to carriage 44 (or the support arm 42 and carriage 44 can be a unitary member). The arm 42, carriage 44, and end effector 40 are moved along the x-axis 54 by guide 46, which preferably includes a guide shaft 56 and a lead screw 58, both oriented parallel to the x-axis 54 and coupled to grounded surface 36. Shaft 56 extends through bore 60 in carriage 44 which allows the carriage to slidably translate along shaft 56. Screw 58 extends through threaded bore 62 in carriage 44, which allows the carriage 44 to move along screw 58 when the screw is rotated about its lengthwise axis. Grounded motor 48 is coupled to screw 58 by a pulley or other transmission mechanism and rotates the screw 58. Thus, when lead screw 64 is rotated, end effector 40 moves along the x-axis along the length of the shaft 56 and screw 58. Motor 48 is preferably a stepper motor or position servo motor and is precisely controlled by computer 20 to position arm 42 and end effector 40.

Other mechanisms can be used to move the wafer pick parallel to the x-axis. For example, the carriage 44 can be driven along a rod by motor gears. Or, the shuttle can be driven by a hydraulic or pulley system, a slide or rail mechanism, or other system providing such translation.

In the described embodiment, end effector 40 is constrained to move only along the x-axis, since end effector movement along the other axes is not necessary in the preferred embodiment and needlessly complicates the end effector mechanism. However, in other embodiments, the end effector can be set up to move in both the x-axis and y-axis directions to, for example, move wafers from different wafer carriers 22. In one such embodiment, the end effector and arm are able to move in a y-axis direction by the use of tracks or guides positioned perpendicularly to the lead screw and guide.

Handler and probe assembly 14 also includes a probe 70. Probe 70 is used to test characteristics of a wafer 21 while the wafer is positioned on the chuck assembly 16. In the described embodiment, probe 70 is coupled to support arm 42 and extends out the bottom surface of the arm 42. In other embodiments, the probe 70 can be coupled to other areas of the arm 42, end effector 40, or carriage 44. In a different embodiment, the probe 70 can be positioned on a separate support arm, similar to support arm 42, which is movable along the x-axis independently of the end effector 40. Probe 70 includes a test head on the bottom portion of the probe which contacts a wafer to make test measurements. In other embodiments, the test head does not need to contact the wafer, but is positioned to a desired distance above the wafer to perform tests (using electromagnetic beams, etc., as is well known to those skilled in the art). The test head includes individual probe leads (shown in FIGS. 5a–5b) which are designed to take test measurements on the wafer surface. In the preferred embodiment, the test head includes a four-point probe apparatus that includes four metal, spring-loaded probes that engage the surface of a wafer. A current is usually induced in the outer probes of the four probes, and a voltage is measured across the inner probes. Such a probe is designed to measure wafer resistivity and film thickness. Four-point probe apparatus are well known in the art. In other embodiments, other types of test probes can be provided to test various characteristics of wafers.

Support arm 42 is operative to position the test head of probe 70 over variable locations on the wafer 21. The probe 70 thus moves parallel to the x-axis along lead screw 58 by the use of motor 48 as the end effector 40 moves along the x-axis.

Handling and probe assembly 14 also includes an edge mapping sensor 72. Sensor 72 senses the edge of the wafer 21 when the chuck assembly 16 and support arm 42 are positioned appropriately (as described below). Sensor 72 includes an emitter 74, which emits a beam of electromagnetic radiation, such as infrared light, across a gap to detector 76, which can be a slit of photodetective material. When the edge of wafer 21 is placed into the gap between the emitter 74 and the detector 76, the edge of the wafer blocks a portion of the emitted beam and the amount of blockage is detected by detector 76. For example, the detector can detect the amount of intensity from the emitted beam and thus detect how much of the beam is blocked. Or, the edge position can be detected by a number of light-detecting sensors such as on a charge coupled device (CCD) array, as is well known. To those skilled in the art. Other types of sensors can also be used; for example, a non-contact capacitive sensor can detect the position of the wafer edge based on capacitance between the wafer and a plate provided below the wafer, as is well known to those skilled in the art. Various types of contact sensors may also be used. The detector outputs a signal to the computer 20 indicative of the amount of penetration of the wafer edge into the sensed field or area.

Typically, the center of wafer 21 is offset from the center of the chuck assembly (or platform) that supports it due to the random position of wafers in the slots of the wafer carrier 22. When the wafer 21 is rotated in place with its edge in the gap, the amount of blockage of the emitted beam varies as the wafer edge moves closer and further from the back of the sensor. If multiple readings of the detector are recorded by the computer over one rotation of the wafer 21, the computer can map the edge of the wafer to find an index mark 134 such as a flat or notch. In addition, from the mapped data, the computer can determine the offset of the center of the wafer compared to the center of the chuck platform. Such methods are well known to those skilled in the art; for example, one example of a process that can be used is described in U.S. Pat. No. 5,452,078, entitled, "Method and Apparatus for Finding Wafer Index Marks and Centers", incorporated by reference herein. Other methods can also be used.

In other embodiments, other types of sensors can be used. For example, an emitter positioned on one side of the wafer can output a beam that is reflected from the surface of the wafer and a detector on the same side of the wafer detects the beam. The beam is used to map the edge of the wafer by moving the emitter to follow the wafer edge as it moves during rotation of the wafer. Such a sensor apparatus is described in U.S. Pat. No. 5,546,179, incorporated by reference herein. However, this type of sensor has disadvantages in that the detection of the beam can be skewed by irregularities, cracks, or unwanted particles on the wafer surface. In addition, the measurement process may be slower than when using the sensor shown in FIG. 1, since the emitter-detector is mechanically moved to follow the edge of the wafer as the edge moves back and forth during rotation, and the wafer may need to be rotated more slowly as a consequence.

Chuck assembly 16 comprises a base platform 82, a testing chuck 84, and a drive assembly 86. Base platform 82 is preferably a structure that supports testing chuck 84 and allows drive mechanism 86 to be located underneath the testing chuck. Testing chuck 84 can be a disc-shaped or other shaped chuck. In the preferred embodiment, the chuck 84 is rotatable about a central z-axis and may be moved upwardly or downwardly parallel to the z-axis 90. Chuck 84 also includes an inner platform 88 provided at the center of the chuck which is rotatable about the z-axis. Platform 88 may also be moved upwardly or downwardly parallel to the z-axis 90 independently of the chuck 84, i.e. moved relative to the chuck 84. In its fully lowered position, the inner platform 88 rests in a circular groove of the chuck 84 such that the top surface of the platform is flush with the top surface 85 of the chuck. When a wafer is positioned on the chuck, inner platform 88 may be raised along the z-axis and lift the wafer in the z-axis with it, as described in greater detail below. In some embodiments, inner platform 88 and/or chuck 84 may also include concentric vacuum grooves or holes (not shown) which are operative to hold wafer 21 to the surface of the platform or chuck when coupled to a vacuum pump that draws air into the grooves or holes. Such vacuum chucks are well-known in the art.

Drive assembly 86 is operative, in the described embodiment, to rotate inner platform 88 and chuck 84 in unison about the z-axis, to move inner platform 88 and chuck 84 in unison along the z-axis, and to move inner platform 88 and chuck 84 relative to each other along the z-axis. In the described embodiment, the drive assembly comprises a pulley 92, a first motor 94, a second motor 96, and a third motor 98 (a fourth actuator is also included as described with reference to FIG. 2c). Pulley 92 is connected to inner platform 88 by a shaft 98 that extends through the base platform 82 and chuck 84 through suitable bearings (not shown). Pulley 92 is connected to motor 94 by a drive belt 100. Motor 94 rotates pulley 92 and thereby rotates shaft 98, chuck 84, and platform 88. Motor 94 is connected to a support 102 of motor 96. One end of support 102 is provided with a threaded nut 104 which engages a lead screw 106 coupled to a shaft of motor 96. Threaded nut 104 can be an anti-backlash nut or a ball screw nut. The support 102 is connected to the main shaft 98 by bearing 108. The far end of support 102 is secured to the motor 94 by a rigid coupling and to guide shaft 110 by a sliding connection. The motor 96 is positioned on a fixed grounded surface 36. When the shaft of motor 96 rotates, the support 102 moves along the z-axis and carries the shaft 98, pulley 92, motor 94, chuck 84, and platform 88 along the z-axis. The bearing 108 of support 102 allows the shaft 98 to rotate freely while still being securely held by the support 102. The movement of platform 88 relative to chuck 84 is described with reference to FIG. 2c. In other embodiments, other mechanisms can be used; for example, a linear actuator can cause the chuck 84 and/or platform 88 to move upwardly and downwardly on the z-axis, and/or gears can transmit the chuck rotational motion.

Motors 94 and 96 are preferably stepper motors or position servo motors controlled by computer 20 through bus 112. The computer can rotate the motors in either direction precisely, allowing the chuck 84 and platform 88 to rotate and move in the z-axis in precisely-defined motions.

Alternatively, the testing chuck 84 can be moved parallel to the x-axis 54 in addition to being rotated. This movement can be implemented, for example, by positioning parallel tracks on the sides of the base platform 82 and moving the chuck assembly 16 along the tracks using wheels or gears.

Computer 20 controls the movement of the components of the apparatus 10 as explained above. Computer 20 can be any suitable controller device, such as an IBM-compatible personal computer based on a Pentium class or other microprocessor, Macintosh computer, workstation, or other computing device.

The apparatus of the present invention is an integrated device that preferably includes handling, mapping, and testing functions at a single workstation. Thus, the end effector 40 is able to manipulate the wafer to the platform, the sensor 72 is able to map the wafer as it is rotated on the platform, and the test head 70 is able to test the wafer on the platform. This configuration substantially reduces the amount of time transporting the wafers, since only a single workstation is necessary.

Figure 2A:
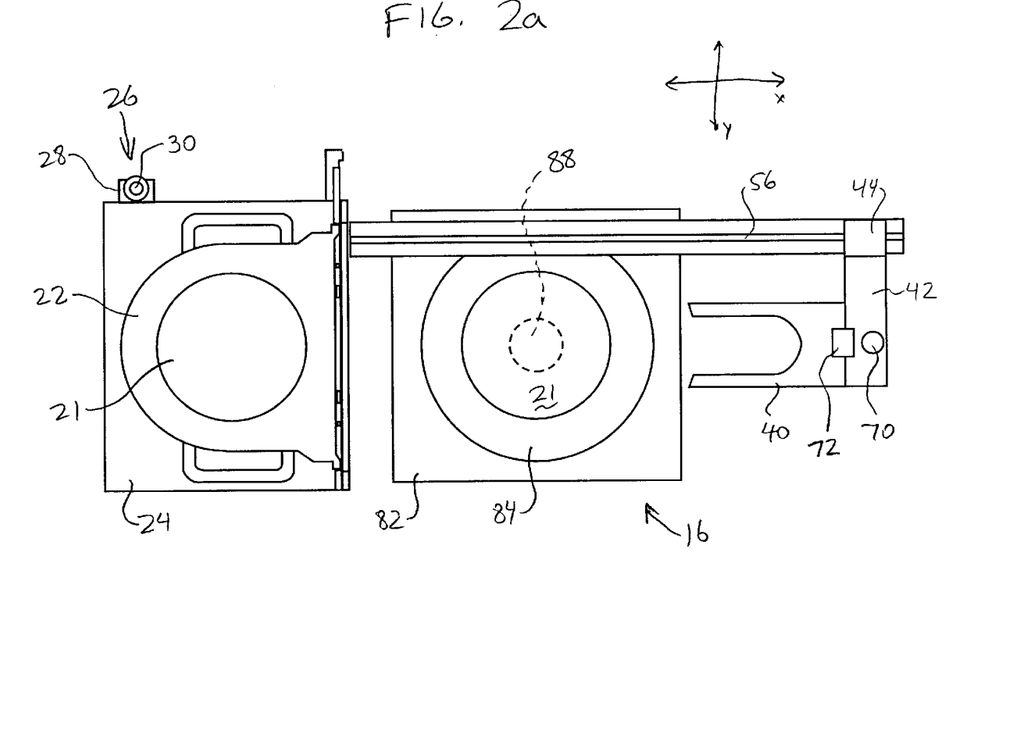
FIGS. 2a and 2b are top plan and side elevation views of the wafer handling and testing system of FIG. 1.

FIG. 2a is a top plan view of the wafer measuring and testing apparatus 10 of FIG. 1. A number of wafers 21 are provided in carrier 22. End effector 40 is preferably aligned with the center of the wafers and with the center of the platform 88 in a direction parallel to the x-axis. A wafer 21 is shown on chuck 84 for exemplary purposes.

Figure 2B:
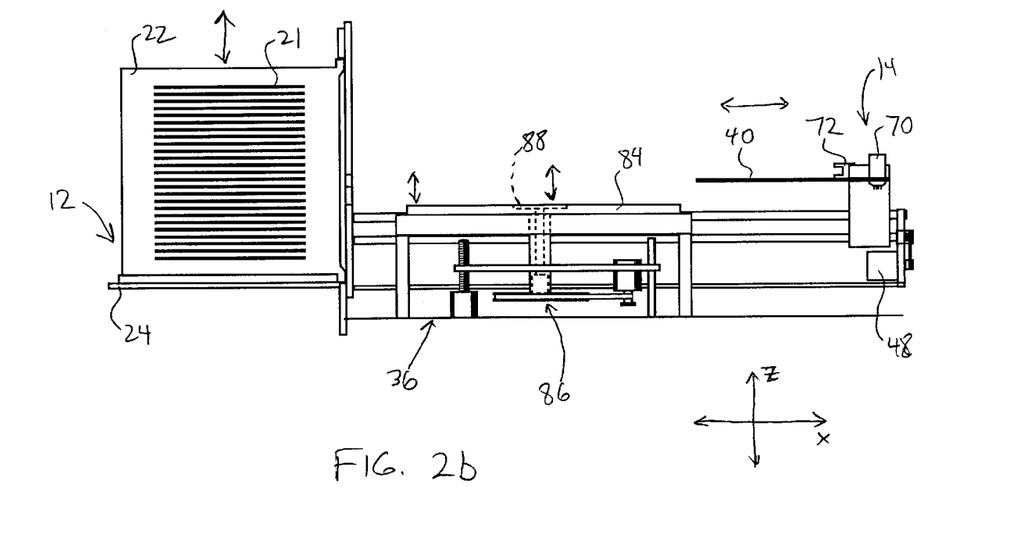

FIG. 2b is a side elevational view of the apparatus 10 of FIG. 1. The apparatus 10 is initially in a state where a wafer is ready to be unloaded from carrier 22 and tested using the apparatus of the present invention. The various motions of the chuck 84, platform 88, handler and probe assembly 14, and wafer carrier holding station 12 are shown with arrows. The wafer handling assembly 14 has movement parallel to the x-axis, the chuck 84 and platform 88 have movement parallel to the z-axis (and rotational movement around the z-axis in the x-y plane, not shown), and the wafer carrier 22 has movement parallel to the z-axis.

Figure 2C:
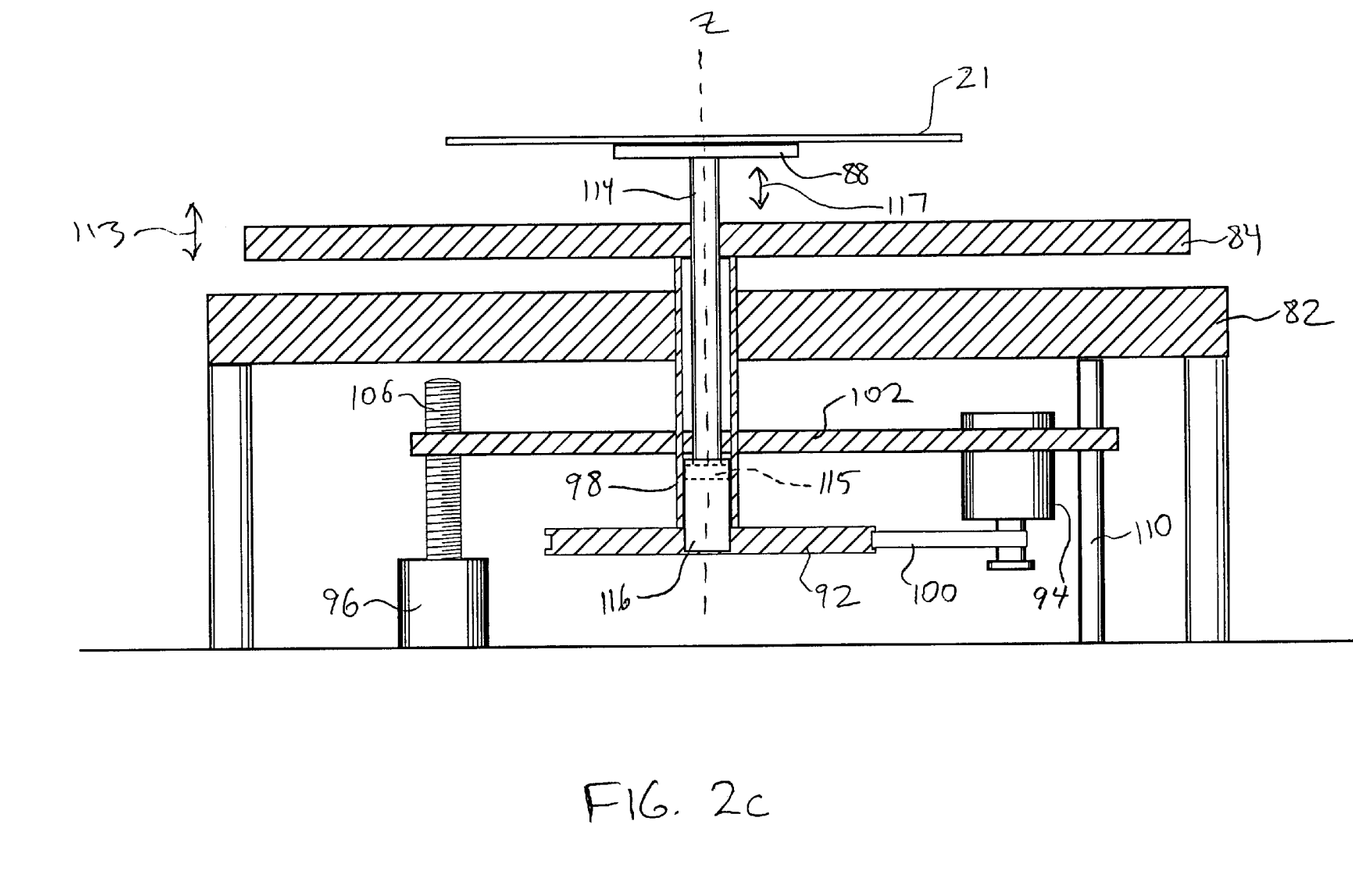
FIG. 2c is a side elevation sectional view of the chuck assembly of the system of FIG. 1.

FIG. 2c is a side elevational sectional view of the chuck assembly 16. Main shaft 98 is coupled to chuck 84 and causes the chuck 84 to move along the z-axis as indicated by arrow 113. In the described embodiment, main shaft 98 has a hollow interior and an inner platform shaft 114 is positioned inside the main shaft. Inner shaft is coupled to platform 88 and is movable along the z-axis independently of the main shaft 98 as indicated by arrow 117. An actuator 116 is preferably used to move the inner shaft 114 and platform 88. Actuator 116, for example, can be a pneumatic valve cylinder including a movable plunger 115 that moves the shaft in a linear degree of freedom as controlled by electrical signals from computer 20. The housing of actuator 116 is preferably rigidly coupled to the main shaft 98 or is built into the main shaft so that the inner shaft 114 will rotate when the main shaft rotates. Different embodiments may include other types of actuators such as motors.

Thus, motor 96 causes support 102 to move up (or down), which carries the main shaft 98, motor 94, and pulley 92 in the same direction. This motion also carries the actuator 116 and inner shaft 114 in the same direction so that the platform 88 and chuck 84 maintain a constant z-position relative to each other. When pulley 92 rotates main shaft 98, the actuator 116 and inner shaft 114 are also rotated so that platform 88 and chuck 84 maintain a constant rotational position relative to each other. Finally, when actuator 116 can be controlled to move inner shaft 114 and thus platform 88 up or down on the z-axis independently of any movement of the main shaft 98 so as to adjust the relative positions between platform 88 and chuck 84.

In other embodiments, other configurations can be used. For example, actuator 116 can be coupled to the bottom of pulley 92 offset from the center of the pulley, and inner shaft 114 can extend out the bottom of pulley 92 to be coupled to the actuator by a right angle joint, thus allowing the actuator to move the inner shaft up or down yet causing the inner shaft to rotate when the main shaft 98 rotates. Alternatively, the inner shaft can be provided with its own rotational actuator so that it does not rotate in unison with the main shaft. In yet other embodiments, a wide-diameter platform can be provided as large or larger than the wafer 21a so that only the platform need move along the z-axis while the chuck 84 can remain stationary. In other embodiments, the platform 88 can remain stationary while the chuck 84 moves downwardly on the z-axis to cause the relative motion between platform 88 and chuck 84 used in centering and mapping the wafer as described below.

Figure 3A:
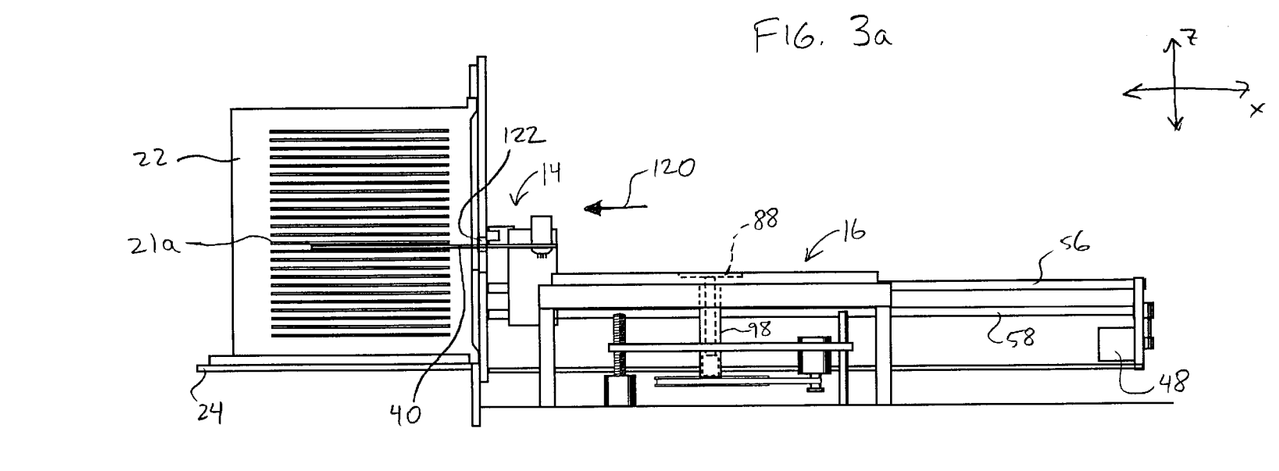
FIGS. 3a–3d are side elevational views of the wafer handling and testing system of FIG. 1 in which a wafer is unloaded and positioned in an edge mapping sensor.

FIG. 3a is a side elevational view of apparatus 10 in which handler assembly 14 has been moved into the carrier 22 to remove a wafer 21a positioned in the carrier. The carrier 22 has been positioned on the z-axis with drive mechanism 26 such that the end effector 40 may be inserted into the carrier just underneath the wafer 21a, which is supported by a guide slot in the carrier. The end effector is moved in the direction indicated by arrow 120 by the motor 48. In some embodiments in which the carrier 22 is an enclosed pod that seals the wafers from contaminants, the end effector can be inserted through a small opening 122 in an interface panel, as is described in co-pending patent application Ser. No. 08/920,210, filed Aug. 25, 1997, by D. Cheng. In many pods and other wafer carriers, the bottom most wafer 21 is typically the wafer that is first tested and/or processed, followed by each wafer positioned in the next higher slot of the carriers.

Once the end effector is fully inserted (as shown in FIG. 3a), the carrier is moved downwardly a short distance on the z-axis to cause the wafer 21a to be left resting on the end effector 40. At this point, the wafer 21a is only being supported by the end effector.

Figure 3B:
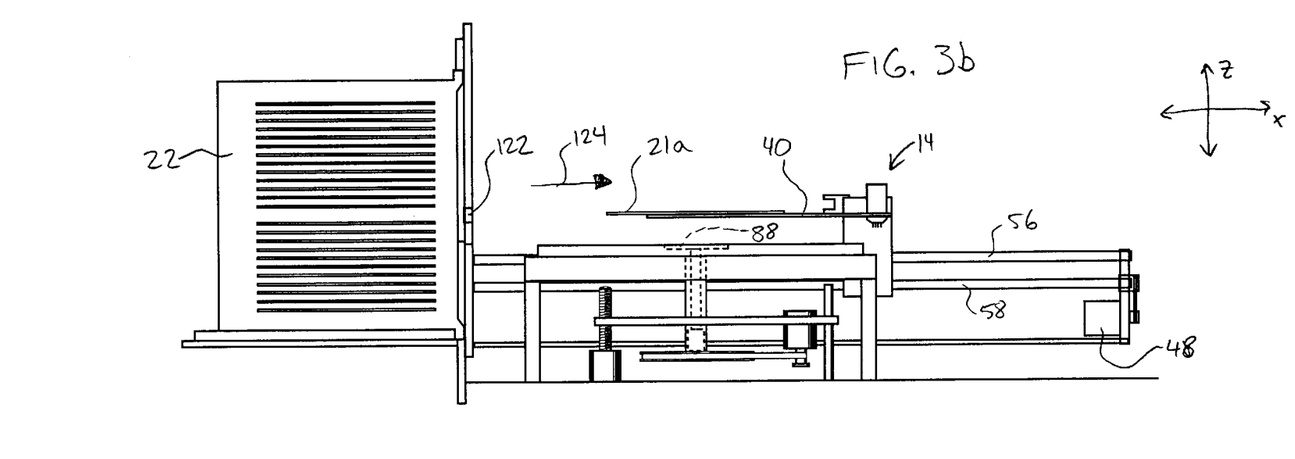

FIG. 3b is a side elevational view of apparatus 10 where wafer 21a has been removed from wafer carrier 22. Wafer 21a rests on end effector 40 such that when wafer handler assembly 14 is moved in the direction shown by arrow 124, the wafer 21a is moved out of the carrier 22 with the assembly 14. Motor 48 controls the rotation of shaft 58 in the opposite direction to cause the wafer handling assembly to move away from the carrier 22. The wafer handler assembly 14 stops moving when the wafer 21a is approximately centered over platform 88.

Figure 3C:
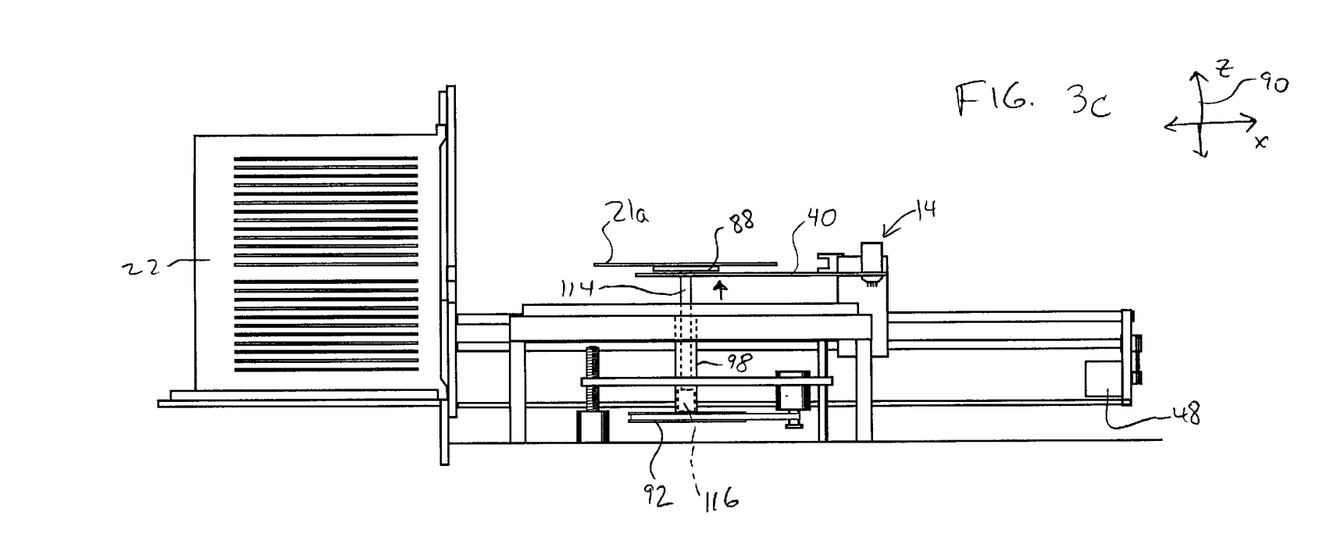

In FIG. 3c, platform 88 has been elevated by motor 96 to raise the wafer 21a from the end effector 40. Actuator 116 moves inner shaft 114 upwardly, which causes the platform 88 to move upwardly while the chuck 84 remains at the lower position. The upward movement is stopped when the platform 88 has lifted the wafer 21a from the end effector as shown in FIG. 3c, where the wafer 21a is at a z-elevation that allows the wafer 21a to be sensed by edge mapping sensor 72.

Figure 3D:
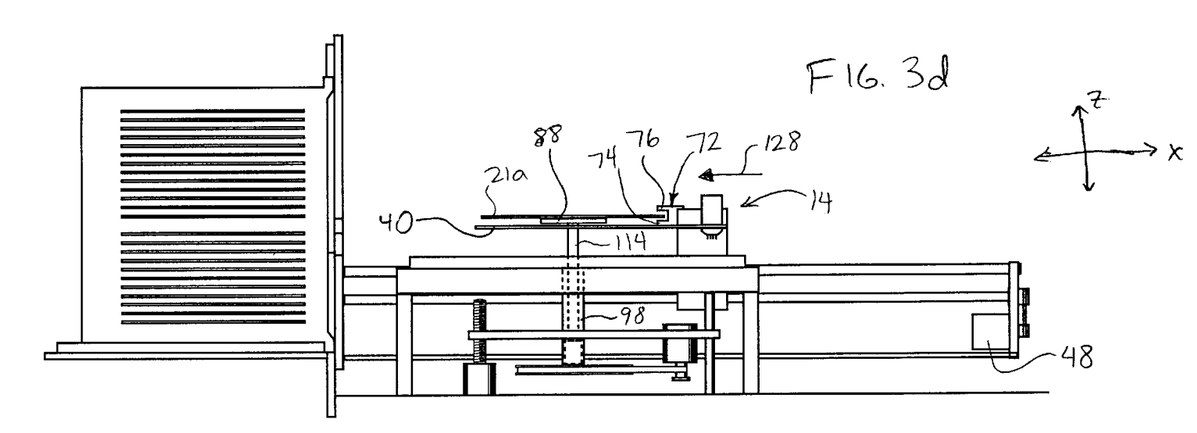

In FIG. 3d, wafer handling assembly 14 is moved to a position to allow the measurement of the wafer edge and center of the wafer 21a. The assembly 14 is moved again toward the wafer carrier 22 through the control of motor 48, as shown by arrow 128, so that the wafer 21a is within the sensing range of edge mapping sensor 72 positioned on the wafer handling assembly. In the described embodiment, the edge mapping sensor 72 has an emitter 76 positioned above a detector 74 (or, detector 74 positioned above emitter 76), and the wafer 21a is in a sensing position when the edge of the wafer 21a is positioned between the emitter and detector. The sensor 72 can be used to determine when the wafer handling assembly 14 should be stopped at the position where the wafer edge is positioned within the sensor. Other types of sensors in other embodiments can be used.

Figures 4A, 4A:
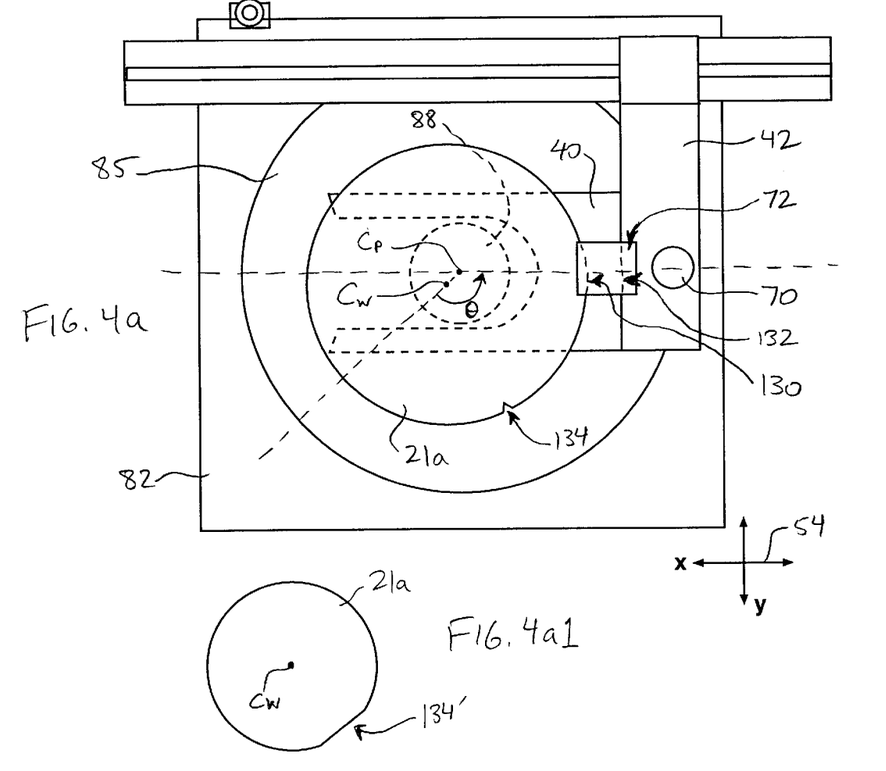

FIG. 4a is a top plan view of chuck assembly 16 and wafer handling assembly 14 in the positions shown with respect to FIG. 3d. Wafer 21a is supported on platform 88, which has been raised above the chuck surface 85 to a level above end effector 40. Wafer handling assembly 14 has been moved toward wafer 21a such that the edge of the wafer 21a is within the sensing range of sensor 72.

At this stage, the wafer 21a is preferably rotated in place on the platform 88. This motion is controlled by motor 94, band 100, and pulley 92, as described with reference to FIG. 1. As shown in FIG. 4a, the wafer is not precisely centered on the platform, i.e., the center $C_W$ of the wafer 21a is shown offset from the center $C_P$ of the platform 88. The amount of offset that is typically present is shown exaggerated in FIG. 4a. Thus, as the wafer is rotated on the platform, the edge 130 of the wafer will move closer and further from the back edge 132 of the sensed area of sensor 72. The sensor 72 relays the distance that the wafer edge extends into the sensor to the computer 20, and the computer 20 preferably records the data as a mapping of the wafer edge. For example, the computer can record the sensor readings as datapoints according to a predetermined sampling rate. A notch 134 is typically provided in wafer 21a as an index mark to orient the wafer in a desired direction. The index mark is mapped by the computer 20 with the other edge data of the wafer, and thus the position of the index mark with respect to the circumference of the wafer and with respect to the center of the rotating platform is known. Other types of index marks can also be provided and mapped. For example, as shown in FIG. 4a1, a wafer 21a having a flat 134' can be used instead of the wafer with notch 134 as shown in FIG. 4a. The flat 134' is used to orient the wafer similarly to the way notch 134 is used. The flat 134' is shown having an exaggerated size in FIG. 4a1 for clarity.

Figure 4B:
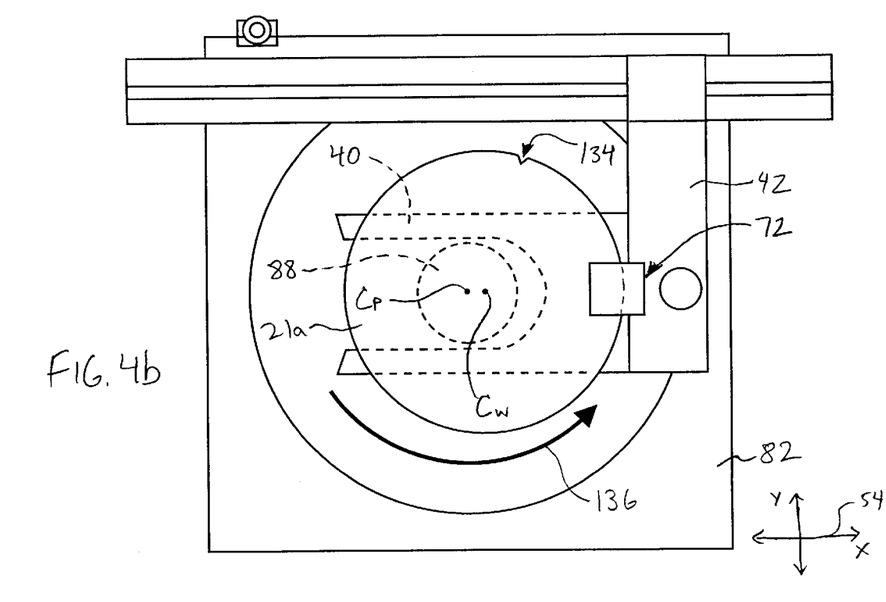

FIG. 4b illustrates a first step of a centering process. After the wafer has been rotated and the wafer edge mapped, the computer 20 knows the offset between the center $C_W$ and $C_P$ using the edge mapping data, since the center of the platform can be derived from the distance that the wafer edge moves during rotation in the sensing field of the sensor 72. Thus, the computer 20 can control the platform 88 and wafer handling assembly 14 to remove this offset to center the wafer. As shown in FIG. 4b, the first step is to rotate platform 88 such that the offset is aligned parallel to the x-axis. The computer 20 determines how much angular range θ exists between the current and desired positions (shown in FIG. 4a), and causes the platform 88 and wafer 21a to be rotated to the desired position. In FIG. 4b, the platform 88 has been rotated in a direction 136 to cause the centers $C_W$ and $C_P$ to be aligned with the direction of travel of end effector 40, e.g. parallel to the x axis 54. As shown, the center $C_W$ is rotated so that it is closer to the end effector than center $C_P$;

alternatively, the wafer can be rotated so that center $C_W$ is further from the end effector than center $C_P$ (i.e., center $C_W$ is at the opposite side of $C_P$ as shown in FIG. 4b).

Figure 4C:
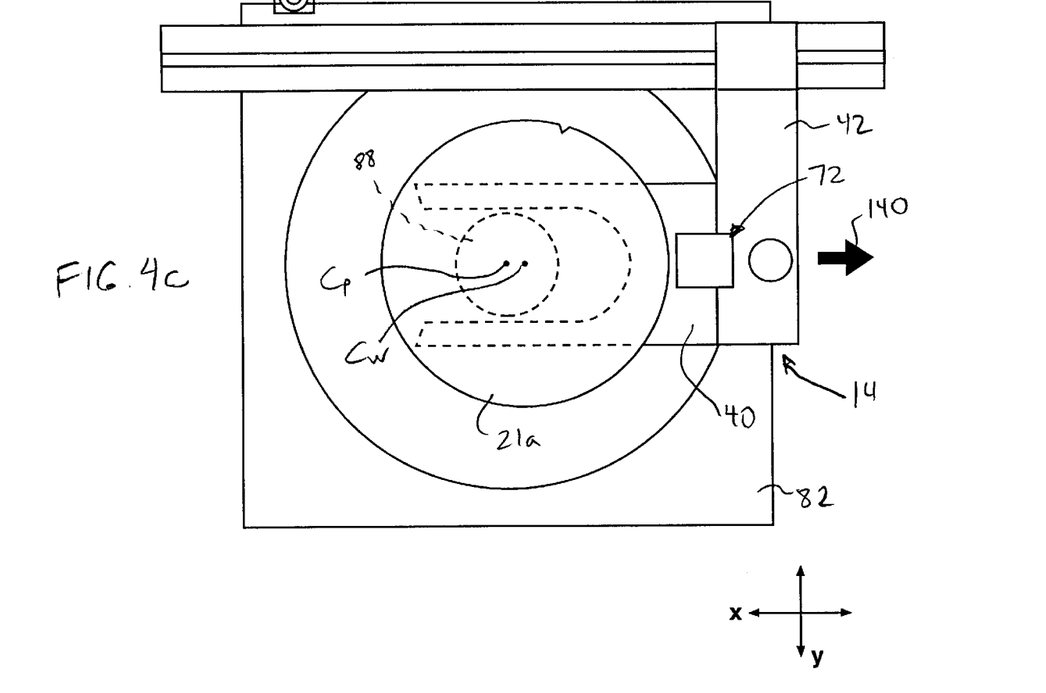

In FIG. 4c, the computer 20 has controlled the wafer handling assembly 14 to move away from the wafer 21a, in the direction shown by arrow 140. This is performed to bring the edge of wafer 21a out from between the emitter and detector of sensor 72 so that the wafer may be lowered onto the end effector 40. In other embodiments where the wafer is not positioned between emitter and detector, the wafer handling assembly need not be moved in direction 140. Once the wafer 21a is no longer in the sensor 72, the platform 88 is lowered so that the wafer 21a rests on the end effector 40.

Figure 4D:
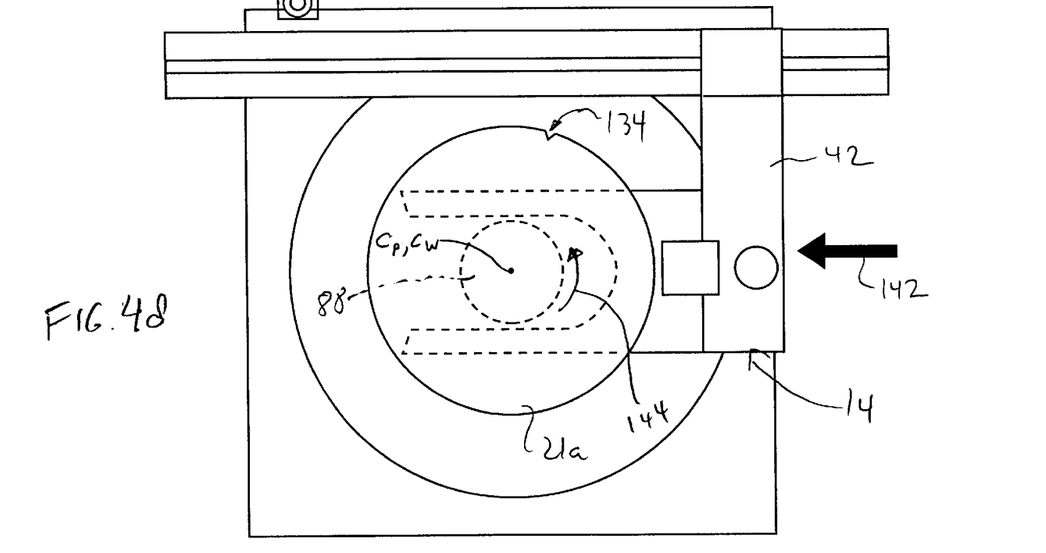

In FIG. 4d, the wafer handling assembly 14 is moved in a direction indicated by arrow 142. This motion carries the wafer 21a in direction 142 and the motion is halted when the wafer center $C_W$ and the platform center $C_P$ are aligned parallel to the z-axis 90. Thus, the wafer 21a has been centered over the platform 88.

Since the platform 88 has its own reference angular position (reference orientation) that is known by the computer 20, the angular orientations of the platform and the wafer can be conveniently aligned at this stage in the process. The computer 20 rotates the platform 88, as indicated by arrow 144, such that a reference angular position of the platform is aligned with the known position of the index mark 134 of the wafer 21a. The computer thus knows that the platform reference position corresponds to the wafer's reference position and can direct the testing of the wafer (described below) based on the angular reference position of chuck 84, since the chuck's angular reference position is at a known, constant offset from the platform's angular reference position. The platform 88 is then raised to lift the wafer from the end effector 40 similarly to the position shown in FIG. 3d.

Figure 5A:
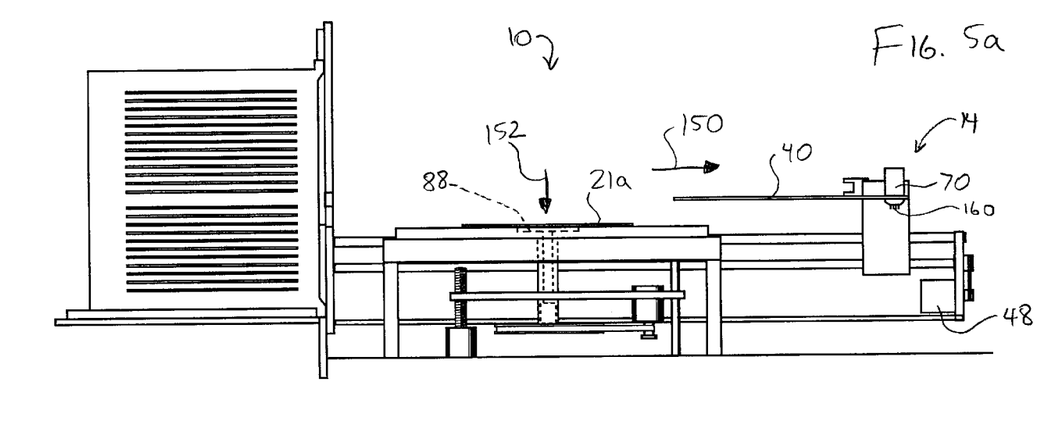
FIGS. 5a and 5b are side elevational views of the wafer handling and testing system of FIG. 1 in which the wafer is moved to a testing position and tested with the apparatus.

FIG. 5a is a side elevational view of the apparatus 10 of the present invention after the wafer centering operation described in FIGS. 4a–4d. The end effector 40 and wafer handling assembly 14 is moved away from the wafer 21a and platform 88 as shown by arrow 150.

Once the wafer handling assembly 14 is moved, the platform 88 and wafer 21a are lowered, as shown by arrow 152. The wafer 21a and platform 88 are lowered so that the top surface of the platform 88 is flush with the top surface 85 of the chuck 84, which allows the wafer 21a to rest fully on the chuck 84. The full surface of the chuck 84 provides support for the entire wafer during the testing process when probes contact the wafer.

Figure 5B:
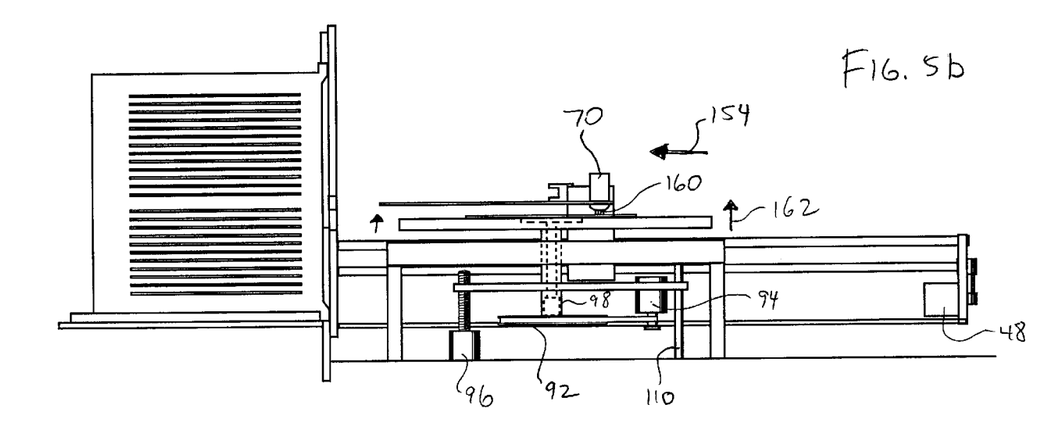

In FIG. 5b, the wafer handling assembly 14 has been moved over the wafer and platform as indicated by arrow 154. When the probes 160 (or other testing contacts, depending on the testing device) are positioned over a desired location on the wafer 21a, the wafer handling assembly 14 is stopped by the computer 20. The chuck 84 is then controlled to move upwardly as indicated by arrow 162, e.g., motor 96 rotates threaded shaft 106, which causes support 102 to move parallel to z-axis 90 as guided by guide 110. Support 102 is coupled to vertical shaft 98, which is coupled to chuck 84; thus, as support 102 moves upwardly, chuck 84 moves upwardly, and carries platform 88 and wafer 21a with it. This causes the wafer 21a to eventually contact the probes 160, at which point the upward movement of the chuck 84 is stopped. The computer 20 can then run the appropriate tests with the test head 70; for example, resistivity readings of the wafer surface or a thin film on the wafer at the location of the probes 160 can be made by running a current through a 4-point probe apparatus, as is well known to those skilled in the art.

When the testing is complete at the current location on the wafer, the chuck 84 can be lowered a short distance, and the wafer assembly 14 can be moved parallel to the x-axis and/or the chuck 84 can be rotated about the z axis to position the probes 160 over a different location on the wafer. The computer knows the locations on the wafer due to the reference position of the platform and the chuck being coordinated with the wafer in the previous wafer orientation process. The chuck is then raised to contact the wafer surface with the probes and the test is conducted at the new location on the wafer. By using both the linear motion of the probe 70 and the rotational motion of the wafer 21a, the entire area of the wafer 21a can be tested by the probes 160.

When testing has been completed for all desired test locations on the wafer surface, the wafer is then raised by platform 88 and lowered onto end effector 40, which carries the wafer 21a back into the wafer carrier 22. This process is substantially the reverse of the process described with reference to FIGS. 3a–3d. The carrier 22 can then be moved parallel to the z-axis to position another wafer 21 in alignment with end effector 40, and the end effector can be inserted to remove the next wafer as described above with reference to FIGS. 3a–3b. In this way, all the wafers in the carrier 22 may be tested. One all the wafers in the carrier have been tested, a different wafer carrier 22 may be placed in the holding station 12 and its wafers tested similarly.

In alternate embodiments, alternate steps to those described above can be performed. For example, the platform 88 can be raised to lift wafer 21a from the end effector 40 after the wafer has been centered, and then the platform 88 can be rotated with the wafer on it to orient the flat in a particular direction, i.e., the reference positions of the platform and the wafer can have an offset that is taken into account by the computer when performing testing operations.

Figure 6:
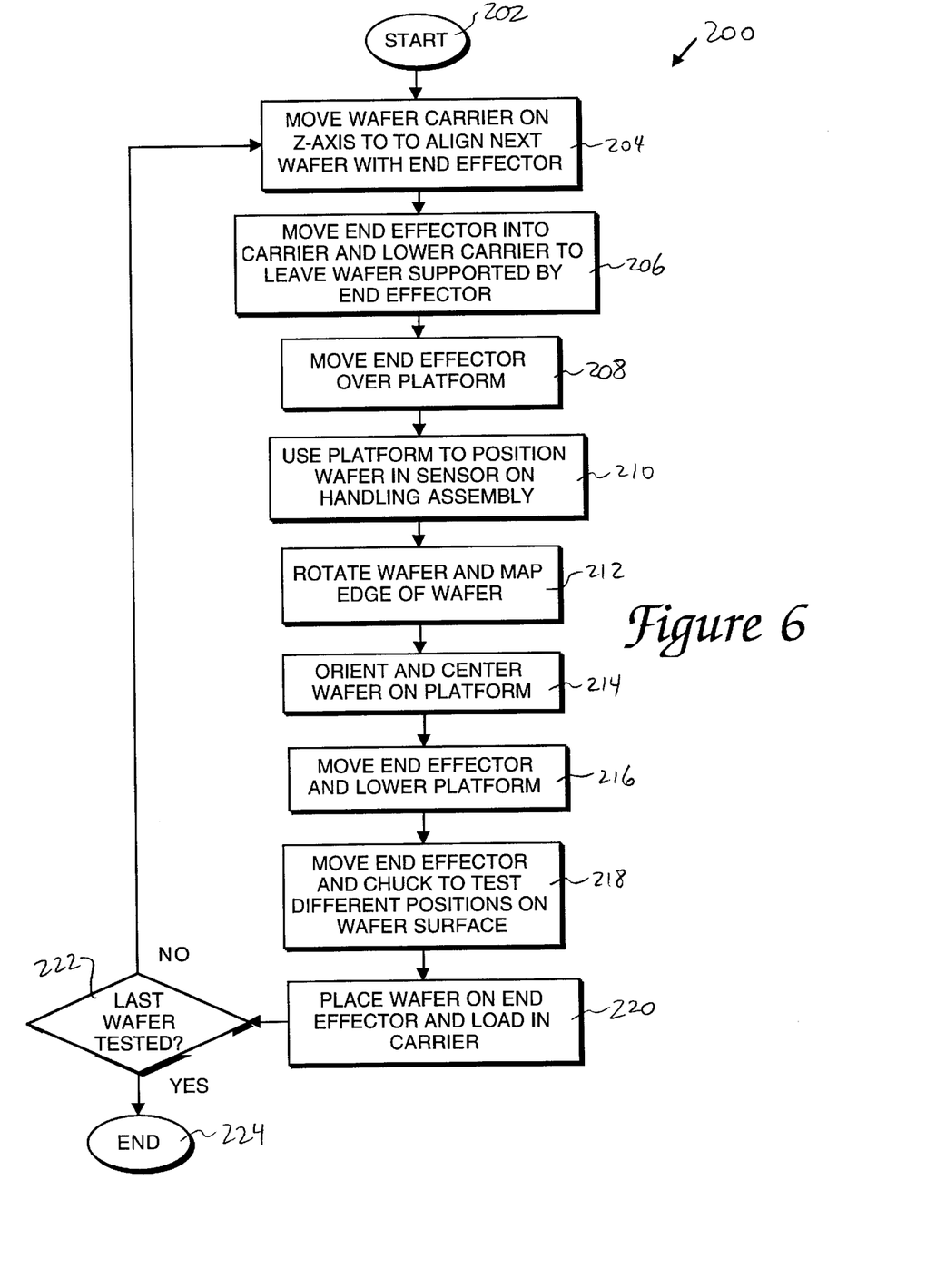
FIG. 6 is a flow diagram illustrating a method of the present invention for handling and testing a wafer.

FIG. 6 is a flow chart illustrating a method 200 of the present invention for unloading a wafer. The steps, in the preferred embodiment, are controlled by computer 20 using the motors of the apparatus 10, where the computer can follow program instructions or code to control the apparatus. Alternatively, some steps can be performed by manual or operator control. The process begins at 202, and in step 204, the carrier is moved on a z-axis using z-axis mechanism 26 so that the desired or "next" wafer to be tested is aligned with the end effector, i.e., positioned just above the x-y plane of the end effector 40. The "next" wafer is the next wafer in the order of wafers in the carrier that has not yet been tested. If no wafers have yet been tested, the next wafer is the first wafer, which, for example, can be the bottommost wafer in the carrier. In next step 206, the end effector 40 is moved into the carrier just underneath the desired wafer. The carrier 22 is then lowered parallel to the z-axis 90 to leave the desired wafer supported by the end effector, i.e., the wafer is lifted off the walls of the slot in which the wafer is positioned so that the wafer is supported only by the end effector.

In step 208, the end effector is moved to the platform position over the platform as shown in FIG. 3b. In step 210, the wafer is positioned in the sensor 72 on the handling assembly 14. This is accomplished by raising the platform 88 to elevate the wafer 21a off the end effector as shown in FIG. 3d and moving the end effector such that the edge of the wafer is positioned between the emitter and transmitter of the sensor 72. In step 212, the wafer is rotated and its edge mapped by the computer 20. In step 214, the wafer is centered and oriented on the platform 88. This is accomplished preferably by rotating the platform and wafer so that the center of the wafer is aligned with the center of the platform parallel to the x-axis. As shown in FIGS. 4c and 4d, the end effector is then moved, the platform is lowered so that the wafer is on the end effector, the end effector moves the wafer so that the centers of wafer and platform are aligned on the z-axis, the platform is rotated to align the reference position of the platform with the index mark of the wafer, and the platform is raised to lift the wafer off the end effector. In step 216, the end effector is moved and the platform is lowered so the wafer is resting on the chuck as shown in FIG. 5a, and in step 218, the end effector is moved on the x-axis and the chuck 84 is moved on the z-axis as appropriate to perform the testing at different locations on the wafer surface. For example, the chuck is raised to contact the wafer with the probes on the wafer handling assembly 14. The end effector is moved on the x-axis and the chuck and wafer are rotated to test different locations on the wafer. Finally, in step 220, after the testing is complete, the wafer is placed back on the end effector and loaded back into the carrier.

In step 222, it is checked whether the last wafer in the carrier 22 has been tested. For example, the number of wafers in the carrier can be entered into the computer by an operator, or a sensor such as a photodetector or similar device can be used to sense the wafers occupying the slots of the carrier. If the last wafer has not been tested, the process returns to step 204 to move the carrier parallel to the z-axis to align the next wafer with the end effector to remove the next wafer. If the last wafer has been tested, then the process is complete at 224. The operator can remove the carrier and load another one at station 12 if desired.

While this invention has been described in terms of several preferred embodiments, it is contemplated that alterations, equivalents, and permutations thereof will become apparent to those skilled in the art upon a reading of the specification and study of the drawings. It is intended that the claims include all such alterations, equivalents, and permutations as fall within the spirit and scope of the present invention.

What is claimed is:

1. An integrated wafer handling and testing apparatus comprising:
    a) a wafer handling assembly moveable as a unit in an x-y plane and which removes a wafer from a wafer carrier, said wafer handling assembly including:
        i) a support arm;
        ii) an end effector, coupled to said support arm, for supporting said wafer; and
        iii) a sensor, coupled to said support arm, for detecting an edge of said wafer;
    b) a chuck including a platform, said platform operative to move in a z-direction approximately perpendicular to a surface of said platform, wherein said wafer is transportable to said platform from said wafer handling assembly and to said wafer handling assembly from said platform; and
    c) a test head that contacts said wafer while said wafer is on said chuck.

2. An apparatus as recited in claim I wherein said platform is lowered and said wafer rests on said chuck when said test head contacts said wafer.

3. An apparatus as recited in claim 2 further comprising a z-movement mechanism coupled to said carrier and operative to move said wafer carrier in a z-direction.

4. An apparatus as recited in claim 2 wherein said end effector is constrained to move only in an x-y plane and not in said z-direction.

5. An apparatus as recited in claim 2 wherein said end effector is constrained to move only in a x-direction and not in said z-direction or a y-direction.

6. An apparatus as recited in claim 2 wherein said sensor includes an emitter and a detector.

7. An apparatus as recited in claim 6 wherein said emitter is operative to be placed on a first side of said wafer and said detector is operative to be positioned on a second side of said wafer such that said detector may detect when a beam from said emitter is blocked by an edge of said wafer.

8. An apparatus as recited in claim 2 wherein said test head is included in said wafer handling assembly, coupled to said support arm.

9. An apparatus as recited in claim 8 wherein said chuck is operative to move in a z-direction to cause said wafer to contact said wafer with said test head.

10. An apparatus as recited in claim 9 wherein said platform and said chuck are moveable in said z-direction relative to each other.

11. An apparatus as recited in claim 8 wherein said test head includes a four-point probe assembly.

12. An apparatus as recited in claim 8 further comprising a computer device for controlling said wafer handling assembly and said platform.

13. An apparatus as recited in claim 2 wherein said end effector includes two prongs separated by a space, and wherein said platform has a diameter such that said platform may be moved between said prongs.

14. An apparatus as recited in claim 2 wherein said platform is operative to rotate, such that said wafer is rotated by said platform, and wherein said sensor is operative to map said edge of said wafer as said wafer is rotated.

15. An apparatus as recited in claim 14 wherein said sensor is positioned on said wafer handling assembly above said end effector such that said wafer is lifted off said end effector by said platform to be aligned with said sensor.

16. An apparatus as recited in claim 2 wherein said carrier is either an enclosed wafer pod or an open wafer cassette holding a plurality of said wafers.

\* \* \* \* \*

UNITED STATES PATENT AND TRADEMARK OFFICE
CERTIFICATE OF CORRECTION

PATENT NO. : 6,164,894  
DATED : December 26, 2000  
INVENTOR(S) : David Cheng

Page 1 of 1

It is certified that error appears in the above-identified patent and that said Letters Patent is hereby corrected as shown below:

Column 6,  
Line 37, reads: "array, as is well known. To those skilled in the art. Other", it should read: -- array, as is well known to those skilled in the art . Other --;

Column 9,  
Line 40, reads: "and other wafer carriers, the bottom most wafer 21 is", it should read: -- and other wafer carriers, the bottommost wafer 21 is --;

Column 14, claim 2,  
Line 7, reads: "2. An apparatus as recited in claim I wherein said platform", it should read: -- An apparatus as recited in claim 1 wherein said platform --.

Signed and Sealed this

Twenty-ninth Day of January, 2002

*Attest:*

JAMES E. ROGAN  
*Attesting Officer*  *Director of the United States Patent and Trademark Office*